United States Patent
Misawa

(10) Patent No.: US 7,292,278 B2
(45) Date of Patent: Nov. 6, 2007

(54) SYSTEM AND METHOD FOR RECORDING MANAGEMENT DATA FOR MANAGEMENT OF SOLID-STATE ELECTRONIC IMAGE SENSING DEVICE, AND SYSTEM AND METHOD FOR SENSING MANAGEMENT DATA

(75) Inventor: Takeshi Misawa, Asaka (JP)

(73) Assignee: Fujifilm Corporation, Tokyo (JP)

( * ) Notice: Subject to any disclaimer, the term of this patent is extended or adjusted under 35 U.S.C. 154(b) by 675 days.

(21) Appl. No.: 10/872,367

(22) Filed: Jun. 22, 2004

(65) Prior Publication Data
US 2004/0239770 A1   Dec. 2, 2004

Related U.S. Application Data

(62) Division of application No. 09/384,553, filed on Aug. 27, 1999, now Pat. No. 6,791,619.

(30) Foreign Application Priority Data

Sep. 1, 1998 (JP) ............... 10-247261
Sep. 1, 1998 (JP) ............... 10-247283

(51) Int. Cl.
*H04N 5/225* (2006.01)
*H04N 5/33* (2006.01)
*B42D 15/00* (2006.01)
*H01L 21/00* (2006.01)

(52) U.S. Cl. .................. 348/342; 348/164; 348/374; 438/57; 283/88

(58) Field of Classification Search ............. 348/87, 348/126, 131, 164, 342, 373, 374; 250/332, 250/333; 438/57, 60, 64, 69; 283/88, 87, 283/89, 91
See application file for complete search history.

(56) References Cited

U.S. PATENT DOCUMENTS 5,134,575 A   7/1992   Takagi
5,644,102 A   7/1997   Rostoker
5,748,448 A   5/1998   Hokari
6,700,613 B1 *   3/2004   Bryant et al. ............... 348/342
6,812,058 B2 *   11/2004   Dennis ....................... 348/342
6,960,753 B2 *   11/2005   Cheung ................... 250/208.1

(Continued)

*Primary Examiner*—John M. Villecco
(74) *Attorney, Agent, or Firm*—Birch, Stewart, Kolasch, & Birch, LLP

(57) ABSTRACT

Management data for managing an image sensing device can be read from the device even after the device has been mounted. To accomplish this, the management data is recorded in a non-effective imaging zone that surrounds an effective imaging area in the read-out area of the image sensing device. The non-effective imaging zone is a zone from which an output signal is not used in generating a sensed target image. The management data can be sensed from the signal output by the image sensing device. In another aspect, management data for managing an image sensing device can be read from the device even after the device has been mounted on a circuit board. To accomplish this, the management data is recorded on a protective glass, which covers the device, using an ink that reflects infrared radiation. A target image having a uniform pattern is sensed using a light source whose emission includes infrared radiation, and the image obtained by such sensing is displayed on a display. The portion of the obtained target image that is the management data appears darker than other portions. The management data is obtained by reading the darkened portion.

13 Claims, 20 Drawing Sheets

U.S. PATENT DOCUMENTS 7,141,774 B2 * 11/2006 Yuyama ................ 250/208.1
2004/0032499 A1 * 2/2004 Silverbrook et al. ..... 348/207.2
2006/0283961 A1 * 12/2006 Misawa et al. ............. 235/492

* cited by examiner

SYSTEM AND METHOD FOR RECORDING MANAGEMENT DATA FOR MANAGEMENT OF SOLID-STATE ELECTRONIC IMAGE SENSING DEVICE, AND SYSTEM AND METHOD FOR SENSING MANAGEMENT DATA

CROSS REFERENCE TO RELATED APPLICATION

This application is a Divisional of U.S. application Ser. No. 09/384,553, filed Aug. 27, 1999 now U.S. Pat. No. 6,791,619, which is expressly incorporated herein by reference in its entirety.

BACKGROUND OF THE INVENTION

1. Field of the Invention

This invention relates to a system and method for recording data that is for the management of solid-state electronic image sensing devices, a system and method for sensing the management data of solid-state electronic image sensing devices, and a solid-state electronic image sensing device.

2. Description of the Related Art

Formed on the front side of a solid-state electronic image sensing device is an imaging area on which the image of a subject is formed. The imaging area is covered with a transparent material such as glass.

Management data (product name, typical specifications, revision number, lot number, applied voltage, date of manufacture, etc.) is recorded on the solid-state electronic image sensing device. If such management data is recorded on the transparent material covering the imaging area, it has an effect upon the image sensing capability of the device. For this reason, the usual practice is to record the device management data on the back side of the solid-state electronic image sensing device.

When the management data is recorded on the back side of the solid-state electronic image sensing device, however, the data is difficult to read after the solid-state electronic image sensing device is mounted. This is because the device is mounted on a circuit board or heat sink with its back side in intimate contact with the board or heat sink. Since the management data is difficult to read, fault analysis of the solid-state electronic image sensing device and control of it, such as changing the applied voltage, also are difficult because the management data is used for such purposes.

SUMMARY OF THE INVENTION

Accordingly, an object of the present invention is to make it possible to read management data comparatively simply even when a solid-state electronic image sensing device is mounted on a circuit board or heat sink, etc., in intimate contact therewith.

According to a first aspect of the present invention, the foregoing object is attained by providing a system for recording management data that is for managing solid-state electronic image sensing devices, comprising: a positioning table for placing a solid-state electronic image sensing device at a predetermined position; a management-data input device (management-data input means) for inputting management data concerning the solid-state electronic image sensing device; and a recording control device (recording control means) for recording the management data, which has been input from the management-data input device, in a non-effective imaging zone within an imaging area of the solid-state electronic image sensing device placed on the positioning table.

The first aspect of the present invention provides also a method suited to the system described above. Specifically, the method comprises the steps of placing a solid-state electronic image sensing device at a predetermined position; inputting management data concerning the solid-state electronic image sensing device; and recording the input management data in a non-effective imaging zone within an imaging area of the solid-state electronic image sensing device that has been placed.

In accordance with the first aspect of the present invention, a solid-state electronic image sensing device is placed on the positioning table and the data for managing the solid-state electronic image sensing device is entered. The recording control device then records the entered management data in the non-effective imaging zone within the imaging area of the solid-state electronic image sensing device.

By capturing the image of a subject using the solid-state electronic image sensing device on which the management data has been recorded in the non-effective imaging zone, the solid-state electronic image sensing device outputs subject-image data representing the image of the subject. The management data can be obtained from the subject image data output by the device.

Since the management data is not recorded on the back side of the solid-state electronic image sensing device, the management data can be read even after the solid-state electronic image sensing device has been mounted on a circuit board or heat sink.

The management data can be recorded by shielding the pixels of the non-effective imaging zone from light. More specifically, the management data can be recorded in bits with pixels serving as the basic units. The management data can be recorded as a binary-coded decimal number. Here "A" through "F", which are not used in decimal numbers, can be employed as recording start and end markers. Further, the management data can be recorded as a binary-coded hexadecimal number. When management data is recorded by a binary-coded hexadecimal number, a specific combination of patterns can be used as start and end markers. If a position at which the management data is recorded is decided in advance, start and end markers will be unnecessary.

When each pixel of the solid-state electronic image sensing device has been formed on a photodiode from a smoothing layer, color filter and on-chip lens, etc., the management data can be recorded in the non-effective imaging zone of the solid-state electronic image sensing device by destroying the photodiode or by blackening at least one of the smoothing layer, color filter and on-chip lens. Blackening can be carried out by using a laser.

Further, an arrangement may be adopted in which the management data is recorded in the non-effective imaging zone by not forming at least one of the smoothing layer, color filter and on-chip lens at each pixel of the solid-state electronic image sensing device. Alternatively, an arrangement may be adopted in which the management data is recorded by forming a black color filter in the non-effective imaging zone.

Further, an arrangement may be adopted in which the management data is recorded in the non-effective imaging zone of the solid-state electronic image sensing device in units of a plurality of pixels.

Further, an arrangement may be adopted in which a plurality of items of management data are recorded in different areas of the non-effective imaging zone. The management data may be the same or different.

Recording a plurality of the same items of management data makes it possible to prevent errors in reading the management data.

An arrangement may be adopted in which a check code (checksum, error correction code, etc.) for checking the management data is recorded in the non-effective imaging zone. An error in the management data can be checked utilizing the check code.

According to a second aspect of the present invention, the foregoing object is attained by providing a system for sensing management data that is for managing solid-state electronic image sensing devices, comprising: a driving device (driving means) for driving a solid-state electronic image sensing device having management data recorded in a non-effective imaging zone within an imaging area; an image sensing device (image sensing means) for sensing an image of a subject using the solid-state electronic image sensing device driven by the driving device, and outputting subject-image data representing the image of the subject; and a management-data output device (management-data output means) for outputting the management data from subject-image data output by the image sensing device.

The second aspect of the present invention provides also a method suited to the system described above. Specifically, the method comprises the steps of driving a solid-state electronic image sensing device, which has management data recorded in a non-effective imaging zone within an imaging area, using a driving device (driving means); sensing an image of a subject using the driven solid-state electronic image sensing device and obtaining subject-image data representing the image of the subject; and outputting the management data from the subject-image data that has been obtained.

In accordance with the second aspect of the present invention, subject-image data representing the image of a subject is output by sensing the image of the subject using a solid-state electronic image sensing device on which management data has been recorded in a non-effective imaging zone. Management data is obtained from the subject-image data output by the solid-state electronic image sensing device.

The data for managing the solid-state electronic image sensing device can be read even-if the solid-state electronic image sensing device has been mounted on a circuit board or heat sink.

Preferably, a target image which has a uniform pattern and which is illuminated by an optically flat light source is sensed. This makes it relatively easy to extract management data from subject image data output by the solid-state electronic image sensing device.

An arrangement may be adopted in which the drive conditions (applied voltage, drive timing, etc.) of the driving device for driving the solid-state electronic image sensing device are changed based upon the output management data.

The present invention further provides a solid-state electronic image sensing device having management data recorded in a non-effective imaging zone thereof.

A system for recording management data that is for managing solid-state electronic image sensing devices in accordance with a third aspect of the present invention comprises: a positioning table for placing a solid-state electronic image sensing device at a predetermined position, the solid-state electronic image sensing device having a transparent cover for protecting a light-receiving area; a management-data input device (management-data input means) for inputting management data concerning the solid-state electronic image sensing device; a material ejection device (material ejection means) for ejecting an invisible-light-responsive material which, by being irradiated with invisible light, emits light relating to the invisible light with which it is being irradiated; and a recording control device (recording control means) for controlling the material ejection device in such a manner that the management data input from the management-data input device will be recorded on the cover of the solid-state electronic image sensing device, which has been placed on the positioning table, using the material ejected from the material ejection device.

The third aspect of the present invention provides also a method suited to the system described above. Specifically, the method comprises the steps of placing a solid-state electronic image sensing device at a predetermined position, the solid-state electronic image sensing device having a light-receiving area and a transparent cover for protecting the light-receiving area; inputting management data concerning the solid-state electronic image sensing device; ejecting a material which, by being irradiated with invisible light, emits light relating to the invisible light with which it is being irradiated; and recording the input management data on the cover of the placed solid-state electronic image sensing device using the ejected material.

In accordance with the third aspect of the present invention, the solid-state electronic image sensing device is placed at a predetermined position. The positioning table may be so adapted that the solid-state electronic image sensing device is attached in the vicinity of the material ejection device. The data for managing the solid-state electronic image sensing device is entered. When this is done, the management data is recorded on the cover of the solid-state electronic image sensing device by the material which, by being irradiated with invisible light (light of a wavelength other than 380 to 780 nm, such as infrared light and ultraviolet light), emits light relating to the invisible light irradiating it.

Thus, when the cover of the solid-state electronic image sensing device on which the management data has been recorded is irradiated with invisible light, light relating to the invisible light is emitted and this emitted light is sensed. The management data is obtained based upon the light relating to the sensed light.

The management data is such that when it is irradiated with invisible light, light relating to this invisible light is emitted. As a result, the management data has no effect upon the image sensing capability of the device even though the light-emitting material of the management data is formed on the cover. The management data can be obtained from the front side of the solid-state electronic image sensing device by irradiating it with invisible light. Thus the management data can be read even after the solid-state electronic image sensing device is mounted on a circuit board, heat sink, etc.

The invisible-light material ejection device ejects at least one invisible-light-responsive material selected from an invisible-light-responsive material which, by being irradiated with invisible light, reflects the invisible light with which it is being irradiated, and invisible-light-responsive material which, by being irradiated with invisible light, emits light having a wavelength different from the wavelength of the invisible light with which it is being irradiated.

An arrangement may be adopted in which the management data is recorded on the cover by at least one of an OCR (Optical Character Reader) font and a bar code. This raises the recognition rate of the management data.

An arrangement may also be adopted in which a reference position of the management data is further recorded on the cover.

When the management data is recognized, it is necessary to cut the management data from the image containing the management data. By recording the reference position on the cover, the reference position can be utilized as a guide for extracting the management data.

An arrangement may be adopted in which a plurality of items of management data are recorded. If one item of management data cannot be read, it will be possible to read the other items of management data.

A management-data check code may be recorded. This will make it possible to check the read management data for errors.

The management data preferably is recorded as an inverted image. When the management data is read as an image, therefore, it will be obtained as an upright image.

The management data preferably is recorded on an area of the cover with the exception of an area that is for forming an image on the light-receiving area. Thus it is possible to prevent the management data from appearing in the imaging area. This is particularly effective when irradiation is performed using invisible light of a high level to read the management data.

A system for sensing management data that is for managing solid-state electronic image sensing devices in accordance with a fourth aspect of the present invention comprises: an irradiating device (irradiating means) for irradiating, with light that includes invisible light, a transparent cover, which is for protecting a light-receiving area, of a solid-state electronic image sensing device driven by a driving device (driving means), wherein management data has been recorded on the cover by a material which, by being irradiated with invisible light, emits light relating to the invisible light with which it is being irradiated; an invisible—light sensing device (invisible-light sensing means) for sensing the light relating to the invisible light emitted from the cover owing to irradiation with the light from the irradiating device; and a management-data output device (management-data output means) for outputting the management data based upon the light relating to the invisible light sensed by the invisible-light sensing device.

The fourth aspect of the present invention provides also a method suited to the system described above. Specifically, the method comprises the steps of irradiating, with light that includes invisible light, a transparent cover, which is for protecting a light-receiving area, of a solid-state electronic image sensing device, wherein management data has been recorded on the cover by a material which, by being irradiated with invisible light, emits light relating to the invisible light with which it is being irradiated; sensing the light relating to the invisible light emitted from the cover owing to irradiation with the light; and outputting the management data based upon the light relating to the sensed invisible light.

Even after the solid-state electronic image sensing device has been mounted on a circuit board or heat sink, etc., the management data can be read by irradiating the cover of the solid-state electronic image sensing device with invisible light.

An arrangement may be adopted in which the drive conditions (applied voltage, drive timing, etc.) of the driving device for driving the solid-state electronic image sensing device are changed based upon the output management data.

The present invention further provides a solid-state electronic image sensing device having: a light-receiving area; a transparent cover for protecting the light-receiving area; and management data that has been formed on the cover by a material which, by being irradiated with invisible light, emits light relating to the invisible light with which it is being irradiated.

As many apparently widely different embodiments of the present invention can be made without departing from the spirit and scope thereof, it is to be understood that the invention is not limited to the specific embodiments thereof except as defined in the appended claims.

BRIEF DESCRIPTION OF THE DRAWINGS

FIG. 10a is a perspective view of an image sensing device and FIG. 10b is a sectional view taken along line X-X of FIG. 10a;

FIG. 14 illustrates an example of management data;

DESCRIPTION OF THE PREFERRED EMBODIMENTS (1) First Embodiment

Figure 1:
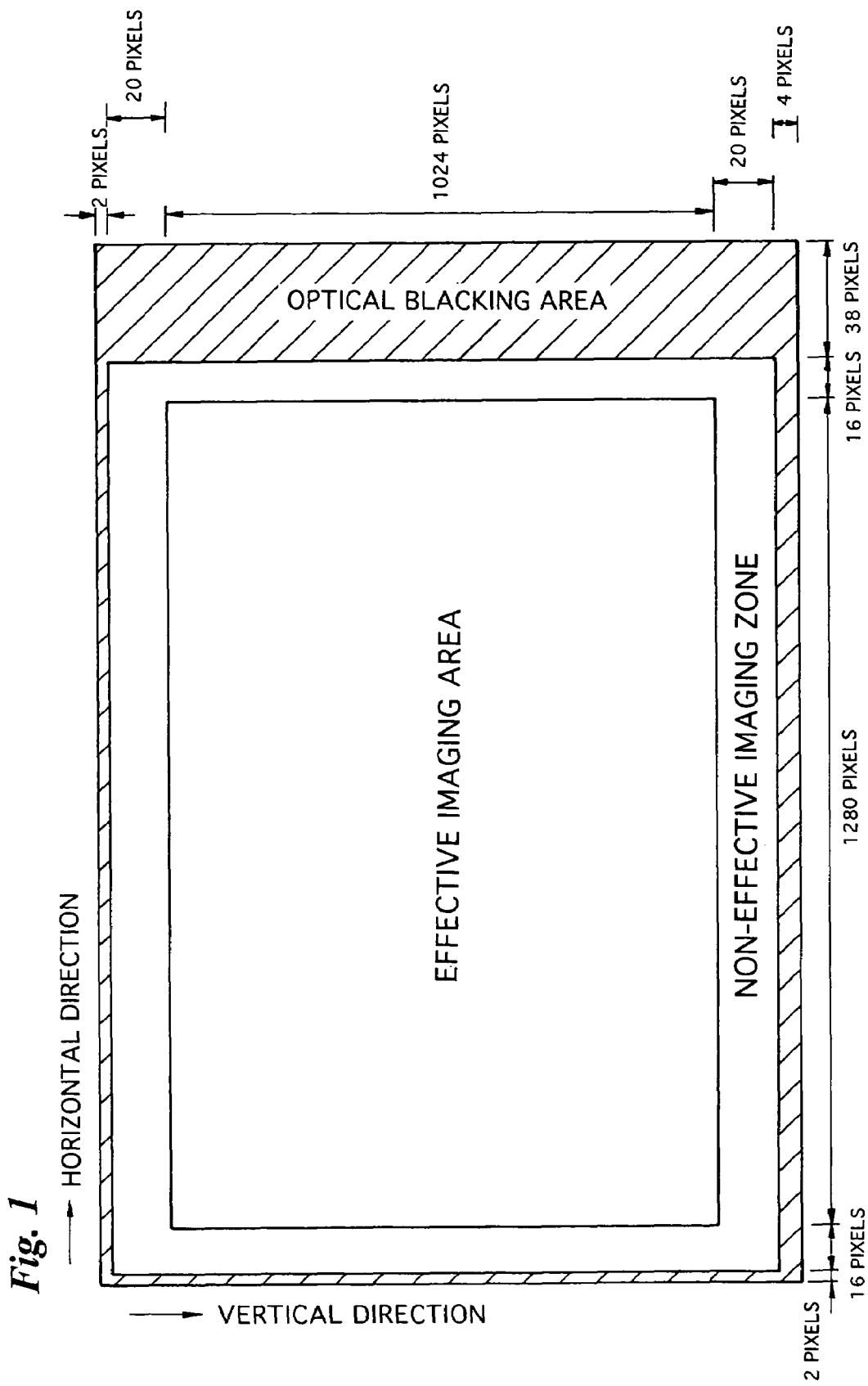
FIG. 1 illustrates a read-out area of an image sensing device.

FIG. 1 illustrates the entire read-out area of an image sensing device (solid-state electronic image sensing device) such as a CCD.

An effective imaging area is formed substantially over the entirety of the read-out area and has 1280 pixels in the horizontal direction and 1024 pixels in the vertical direction. The image of a subject formed in the effective imaging area is an image represented by a video signal read out of the effective imaging area.

A non-effective imaging zone is formed about the perimeter of the effective imaging area. The non-effective imaging zone is an area in which the video signal obtained is not used in generating the image of a subject. The non-effective imaging zone has a width of 16 pixels in the horizontal direction on both the left and right sides of the effective imaging area and a width of 20 pixels in the vertical direction on both the top and bottom sides of the effective imaging area.

Further, an optical blacking area is formed about the perimeter of the non-effective imaging zone. The optical blacking area is masked (indicated by the hatching). A video signal obtained from the optical blacking is used as a reference black-level signal. The optical blacking area has a width of two pixels at the top, four pixels at the bottom, two pixels on the left side and 38 pixels on the right side.

In this embodiment, data (serial number, lot number, revision number, applied voltage and drive timing, etc.) for managing the image sensing device is recorded in the non-effective imaging zone. The management data is recorded with the pixels of the non-effective imaging zone serving as bits.

FIGS. 2 to 5 illustrate manners in which management data concerning the image sensing device can be stored in the non-effective imaging zone. FIGS. 2 to 5 all show the areas that are located in the top part of the read-out area. It goes without saying that the management data concerning the image sensing device may be recorded in the non-effective imaging zone located on the right and left sides of the read-out area or in the non-effective imaging zone located on the bottom side of the read-out area rather than in the non-effective imaging zone located at the top of the read-out area.

In FIGS. 2 to 5, "R" indicates the formation of a red filter, "G" the formation of a green filter and "B" the formation of a blue filter.

Figure 2:
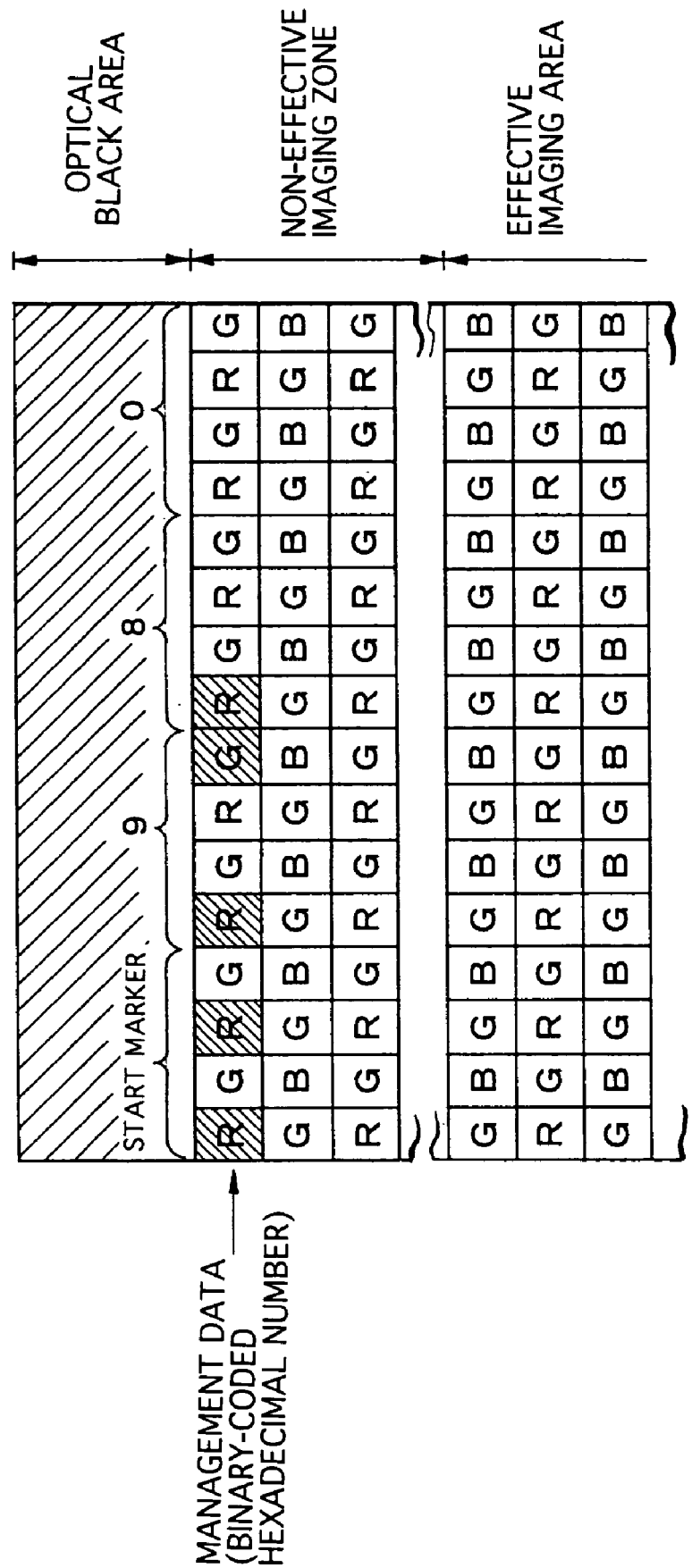
FIGS. 2 to 5 illustrate manners in which management data can be recorded in a non-effective imaging zone.

As shown in FIG. 2, management data has been recorded by blackening pixels in the first line of pixels of the non-effective imaging zone. The blackened pixels are indicated by the hatching. One numeral or the like of management data is represented using four contiguous pixels in the horizontal direction. The management data is represented by a binary-coded decimal numbers. The first four pixels indicate a start marker, the next four indicate "9", the next four indicate "8" and the last four indicate "0".

By discriminating the level of the video signal output of the non-effective imaging zone using a predetermined threshold value, the management data can be sensed from the video signal output of the non-effective imaging zone.

Figure 3:
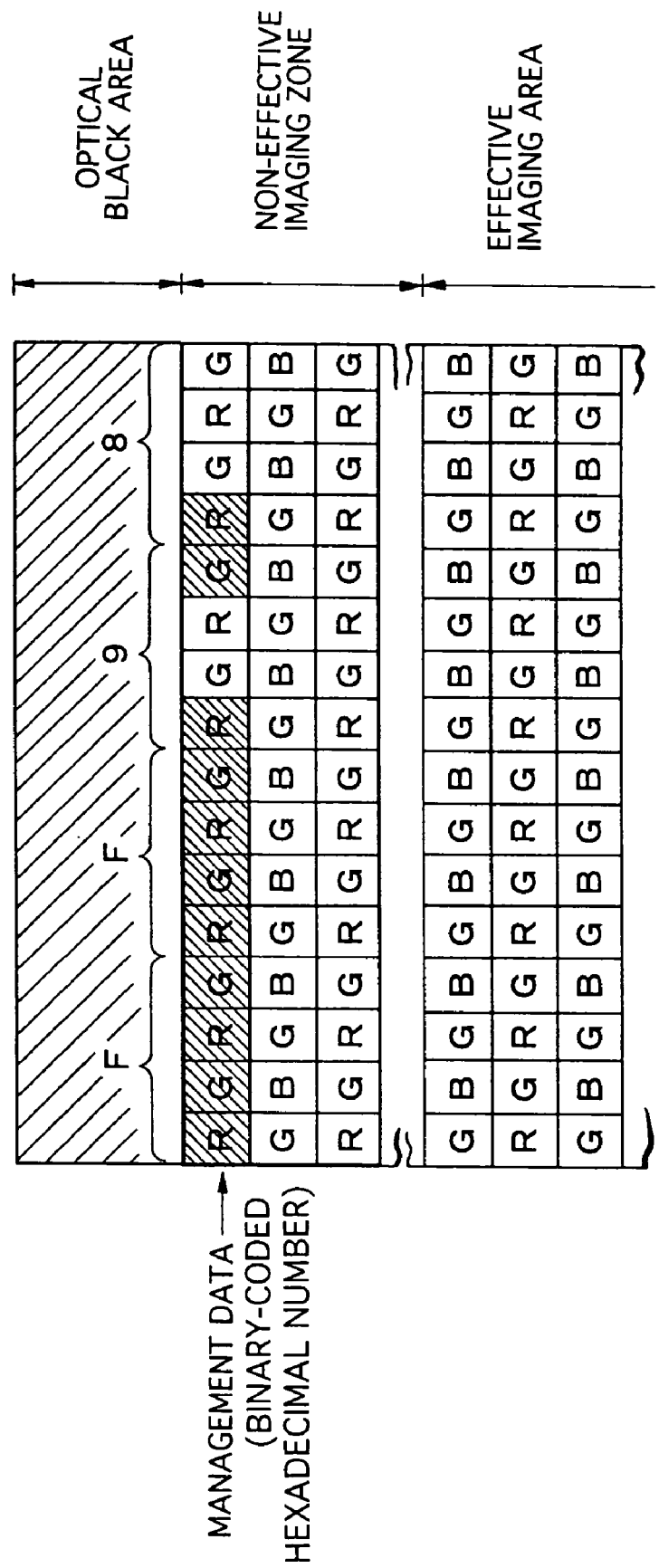

FIG. 3 illustrates an embodiment in which management data is recorded in the non-effective imaging zone using binary-coded hexadecimal numbers.

Here "F" is represented by the first four pixels, "F" again by next four pixels, "9" by the next four pixels and "8" by the last four pixels. In this example, the start marker is represented by the first two "F"s. It goes without saying that deciding the storage location of the management data in advance would make a start marker unnecessary.

Figure 4:
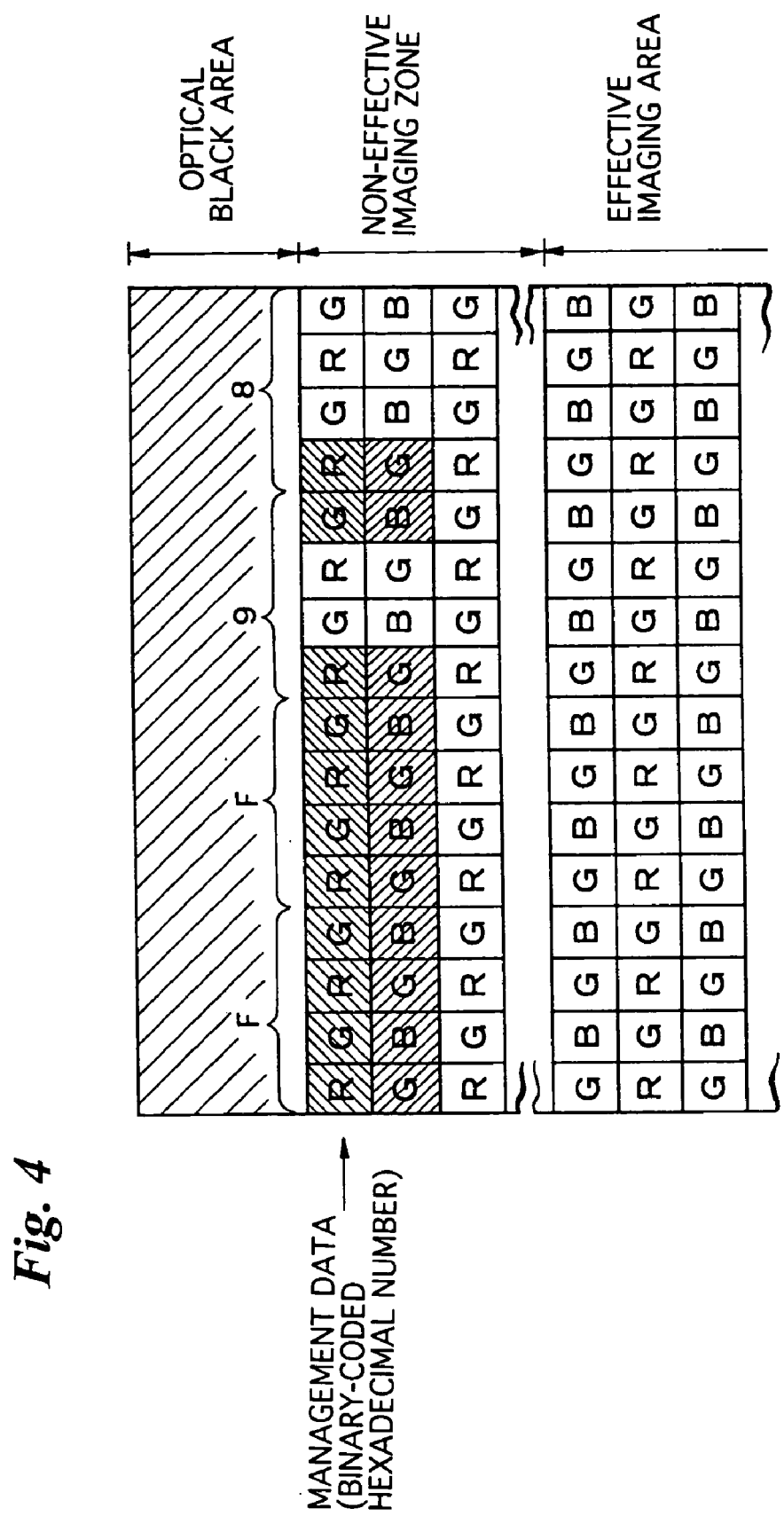

FIG. 4 illustrates an embodiment in which management data is recorded using two lines of the non-effective imaging zone.

Identical management data has been recorded on the first and second lines of the non-effective imaging zone. Since identical management data has been recorded, the management data can be read out even if the image sensing device has developed faulty pixels. When faulty pixels occur, however, two different types of management data are read out, making-it impossible to tell which management data is correct. This would make it necessary to record a checksum.

Figure 5:
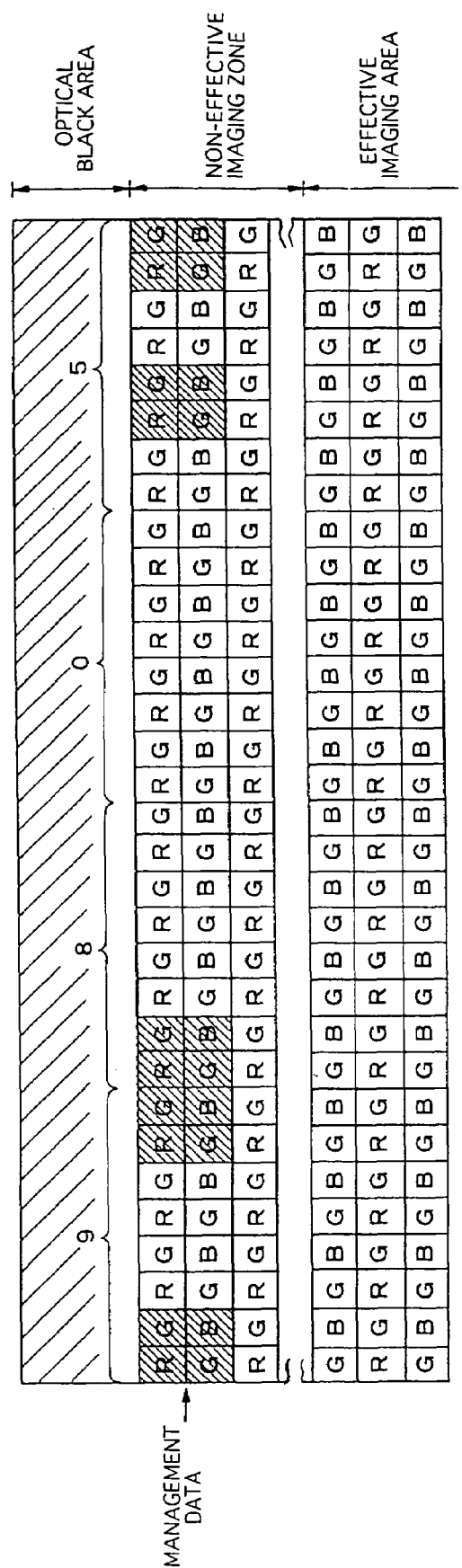

FIG. 5 illustrates a case where four pixels comprising two adjacent pixels in the horizontal direction and two adjacent pixels in the vertical direction are considered as one block. In other words, here management data is recorded by allocating four pixels to one bit.

In a case where management data is recorded by allocating four pixels to one bit, where the four pixels comprise two adjacent pixels in the horizontal direction and two adjacent pixels in the vertical direction, two types of checksums (one for odd-numbered pixels and one for even-numbered pixels) would be required for each of the two lines.

In the examples of the recording of management data described above, an error correction code such as a Reed-Solomon code can be used instead of a checksum.

Figure 6:
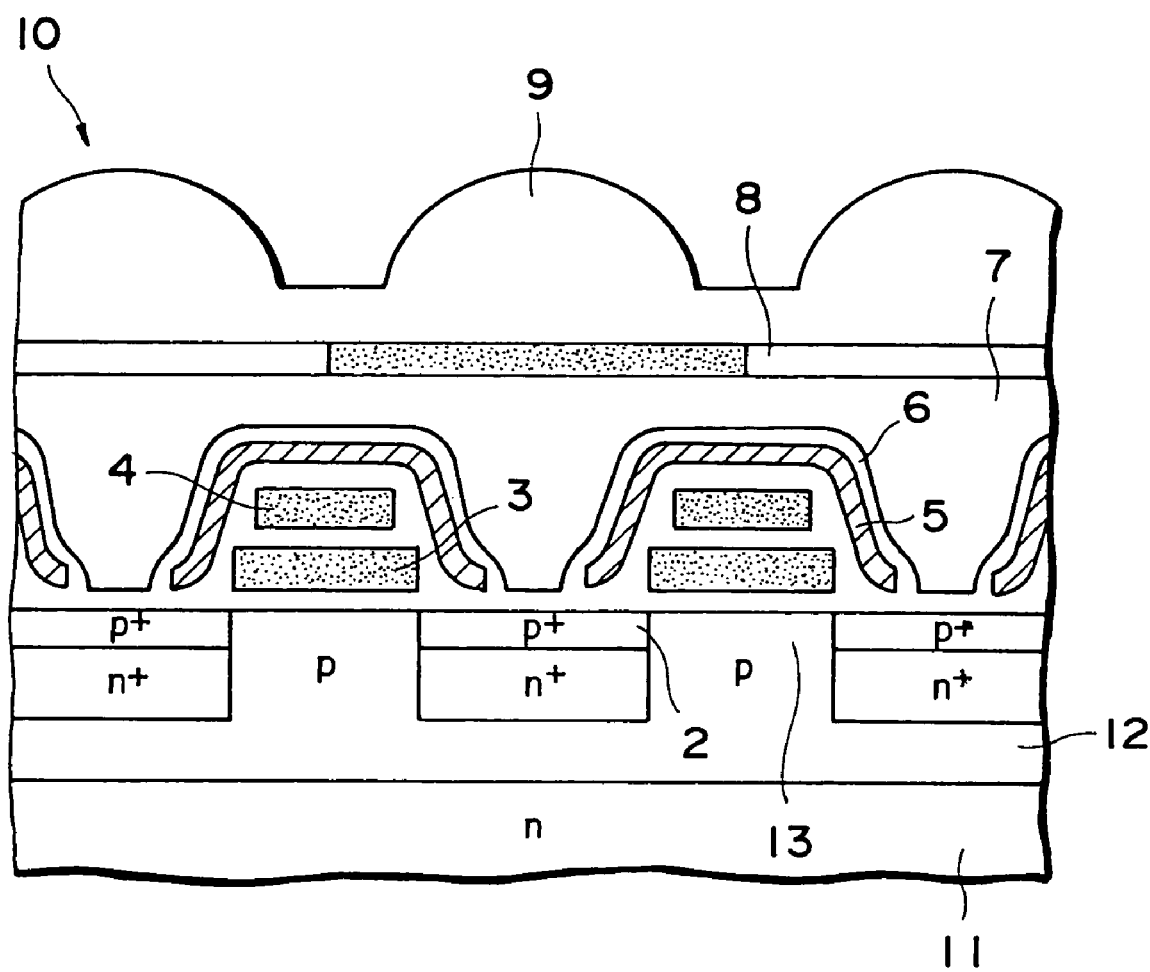
FIG. 6 is a sectional view illustrating pixel portions of the image sensing device.

FIG. 6 is a sectional view showing the pixel portions of an image sensing device 10.

A p-type layer 12 is formed on an n-type substrate 11, and a photodiode 2 is formed in the p-type layer 12. Signal charge commensurate with the quantity of received light accumulates in the photodiode 2 by sensing the image of a subject. A video signal representing the image of the subject is obtained by reading out the signal charge. The photodiode 2 corresponds to a pixel in the image sensing device described above. The portion of the p-type layer 12 adjoining the photodiode 2 serves as a transfer line 13 for transferring the signal charge.

A first-layer polysilicon gate 3 and a second-layer polysilicon gate 4 are formed on the transfer line 13. The signal charge is transferred in the transfer line 13 by applying a voltage to the gates 3 and 4. A light shielding layer 5 is formed on the second-layer polysilicon gate 4, and a protective film 6 is formed on the light shielding layer 5.

An RGB color filter layer 8 is formed on the protective film 6 via a smoothing layer 7, and an on-chip lens 9 is formed on the color filter layer 8 at a position that corresponds to the photodiode 2. The image of the subject is formed on the photodiode 2 by the on-chip lens 9.

In the image sensing device thus constructed, a pixel can be blacked by blackening the on-chip lens 9, the color filter layer 8 or the smoothing layer 7. It. is also possible to blacken a pixel by destroying the photodiode 2. A laser can be utilized for blackening, as will be described later. The laser is adjusted so as to focus the laser beam on the target to be blackened.

Figure 7:
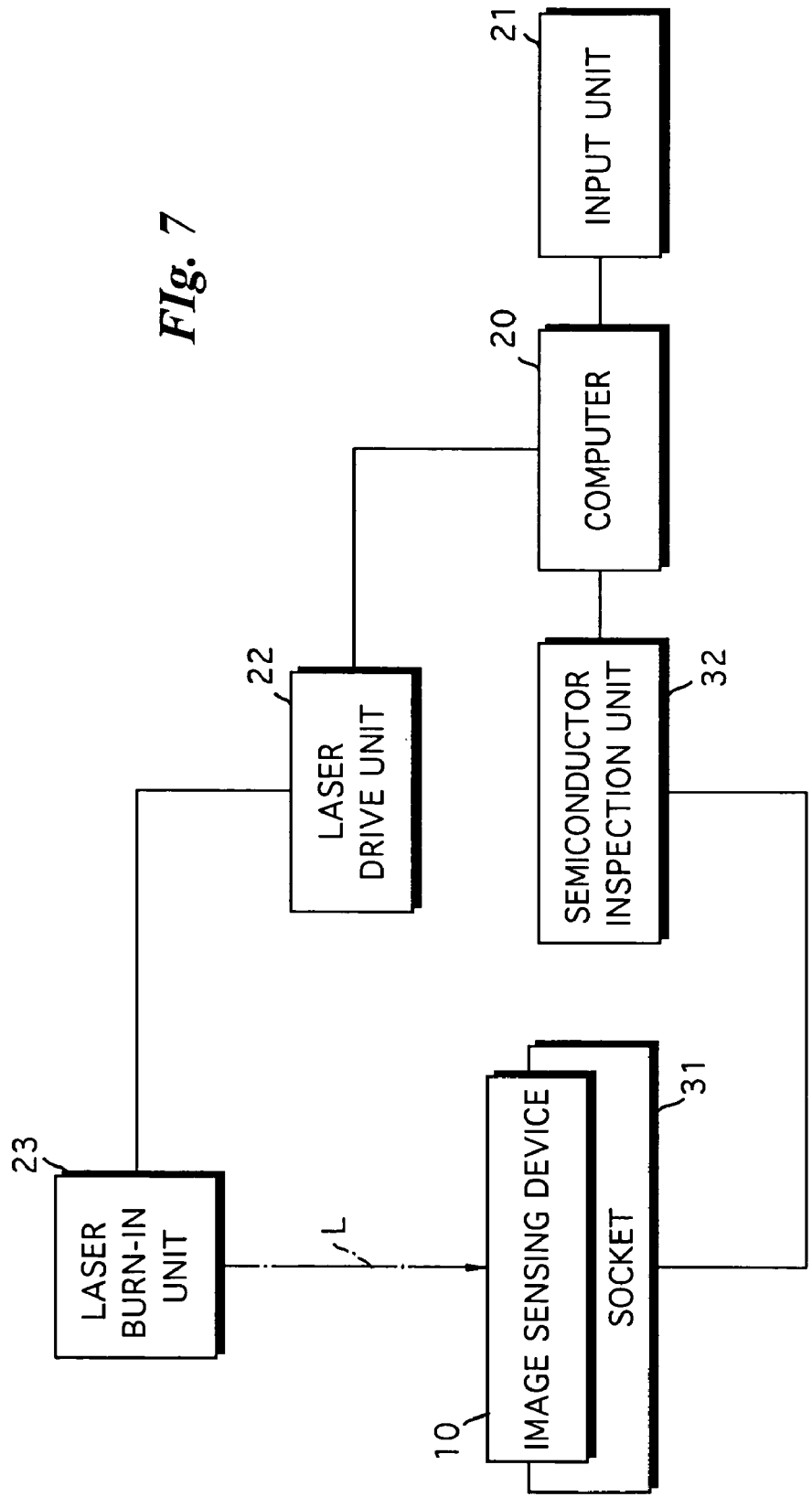
FIG. 7 is a block diagram illustrating the electrical configuration of a management-data recording system.

FIG. 7 is a block diagram illustrating the electrical configuration of a management-data recording system.

The overall operation of the management-data recording system is supervised by a computer 20.

The image sensing device 10 to which management data is to be written is placed on a socket 31 connected to a semiconductor inspection device 32 and is positioned at a predetermined location.

Management data is input from an input unit 21 and is applied to the computer 20. The computer 20 controls a laser control unit 22, which in turn controls a laser burn-in unit 23. The latter incorporates a laser that emits a laser beam "L" based upon control performed by the laser control unit 22. The laser beam "L" irradiates pixels in the non-effective imaging zone of the image sensing device 10 placed in socket 31 and blackens prescribed ones of the pixels. As a result, the management data is recorded in the non-effective imaging zone in the manner described above.

Figure 8:
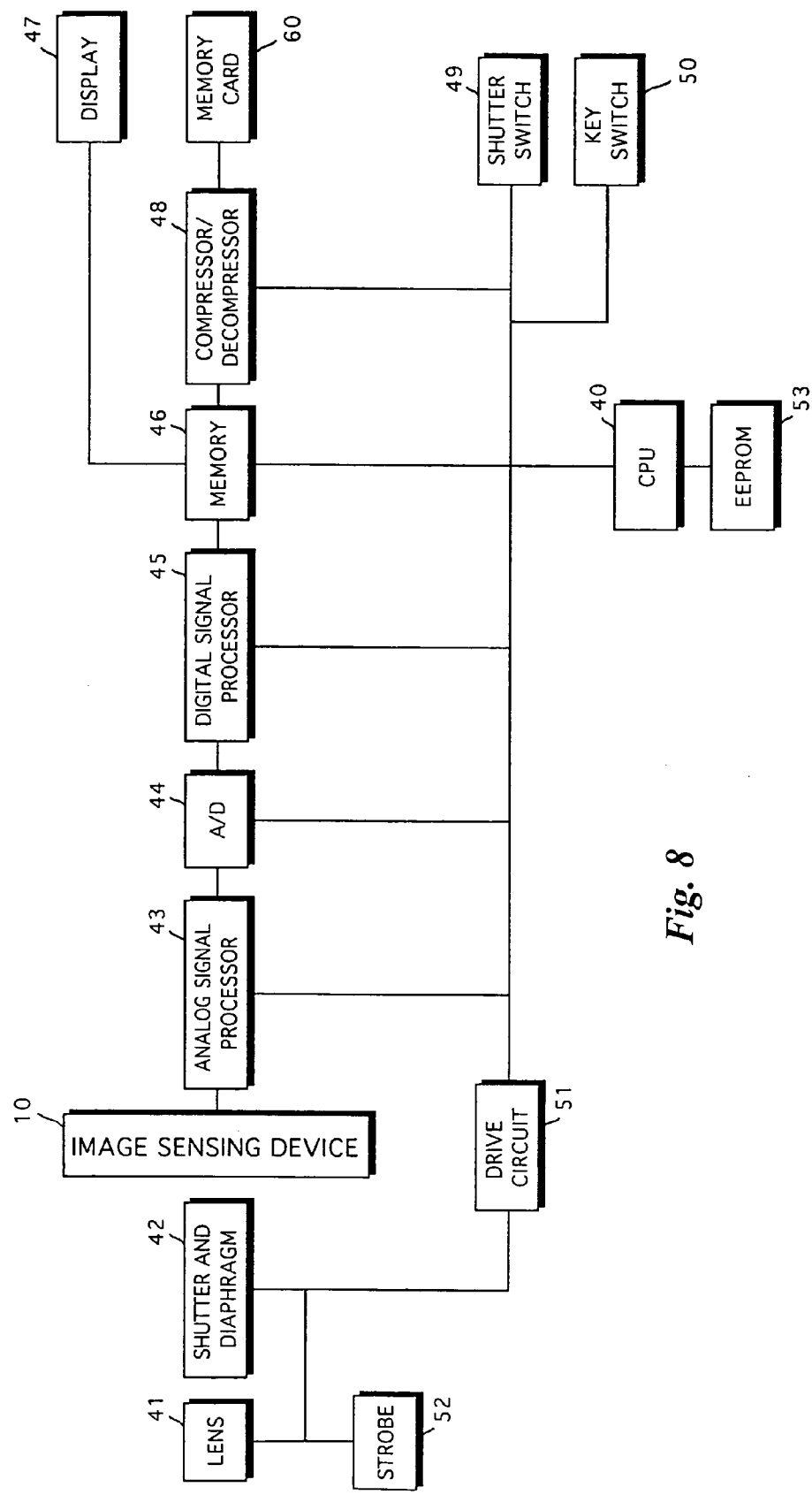
FIG. 8 is a block diagram illustrating the electrical construction of an electronic still-video camera.

FIG. 8 is a block diagram illustrating the electrical construction of an electronic still-video camera (management-data sensing system).

Management data concerning an image sensing device can be read even after the image sensing device has been installed in the camera.

The overall operation of the electronic still-video camera is supervised by a CPU 40. The camera is provided with a shutter switch 49 and a key switch 50. Signals indicative of the settings of these switches are input to the CPU 40. The camera is further provided with a strobe 52 for taking a picture of a subject using strobe photography.

A flat light source is set up and a target image having a uniform (e.g. all-white) pattern illuminated by the flat light source is prepared.

The image representing the target image is formed on the image sensing device 10 by an imaging lens 41 via a shutter and diaphragm 42. Management data has been recorded on the image sensing device 10 in the non-effective imaging zone in the manner described earlier.

The image sensing device 10 is driven by a drive circuit 51 and outputs a video signal (inclusive of a signal representing the management data) representing the target image. The video signal output by the image sensing device 10 is input to an analog signal processing circuit 43. The signal processing circuit 10 subjects the video signal to signal processing such as a gamma correction and color-balance correction, and the resulting signal is input to an analog/digital conversion circuit 44, whereby the signal is converted to digital image data.

The digital image data is applied to a digital signal processing circuit 45, which proceeds to generate luminance data Y and color difference data B-Y and R-Y. The luminance data Y and color difference data B-Y, R-Y is applied to a memory 46, where this data is stored temporarily.

The luminance data Y is read out of the memory 46 and input to the CPU 40. The latter extracts the management data from the luminance data Y.

Figure 9:
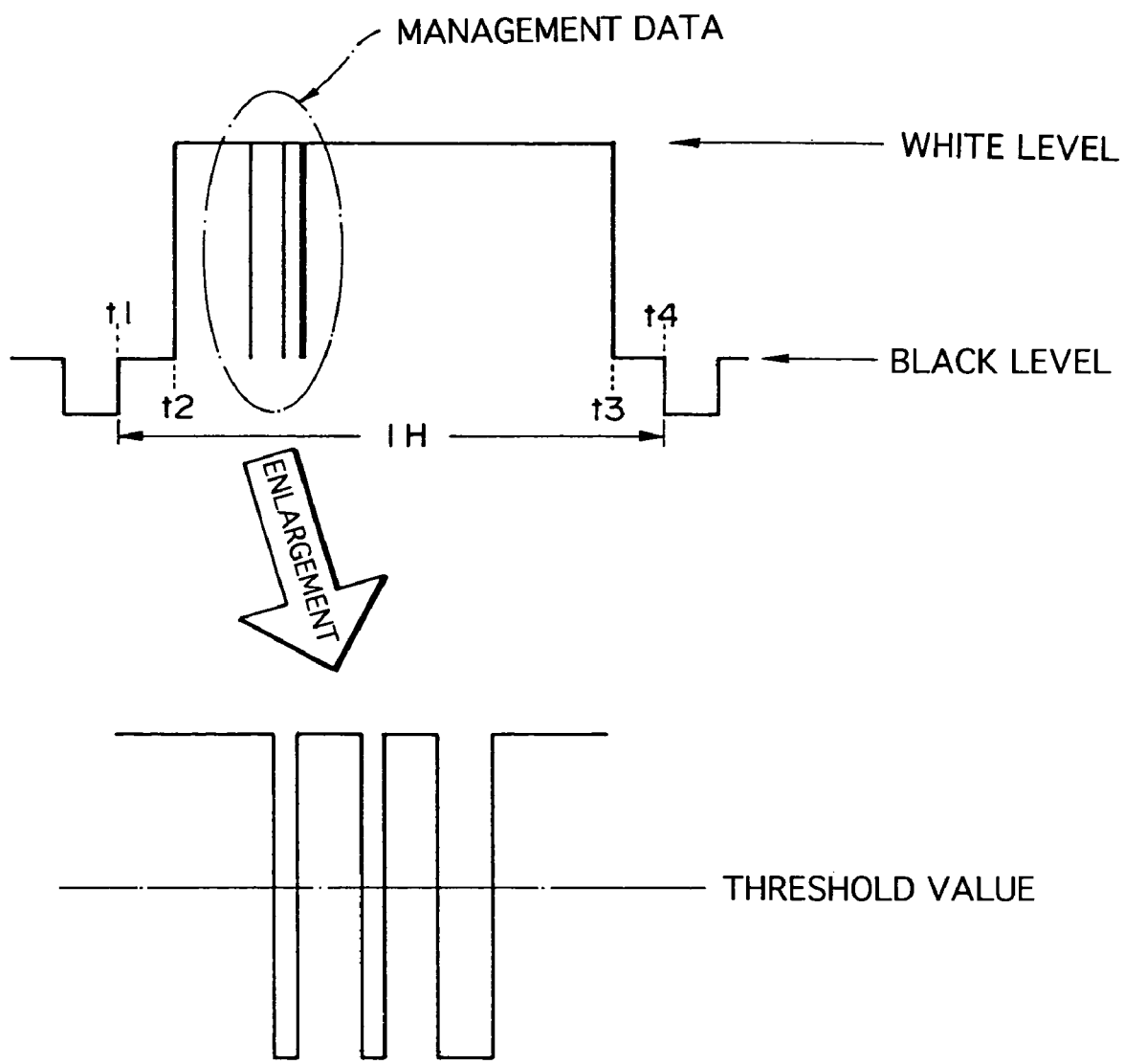
FIG. 9 is a diagram showing an example of a video signal output by the image sensing device.

FIG. 9 illustrates the video signal (luminance data Y) obtained by reading out pixels on a line on which the management data has been recorded. This video signal is that of one H (horizontal scanning line). The portion of the video signal in the period of time from time t1 to time t2 and in the period of time from time t3 to time t4 are signal portions read out of pixels in the optical blacking area (namely signal portions of a black level), and the portion of the video signal in the period from time t2 to time t3 is the signal portion read out of pixels in the non-effective imaging zone.

The portions at which the signal level falls to the black level between times t2 and t3 are the locations at which the management data has been recorded. (Since the management data has been recorded by blackening pixels in the manner described above, the signal level falls to the black level at these locations.) The management data is sensed from the video signal (luminance data Y) by level discrimination using a predetermined threshold value. The processing for sensing the management data is executed by the CPU 40, and the management data that has been sensed is stored in an EEPROM 53.

The management data is read out of the EEPROM and applied to the CPU 40. The latter converts the management data to numerical values. The management data in the form of numerical values is applied to a display 47 via the memory 46. Thus the management data is visually displayed.

The luminance data Y and color difference data B-Y, R-Y stored temporarily in the memory 46 is read out and applied to the display 47, whereby the target image is displayed on the display 47.

The luminance data Y and color difference data B-Y, R-Y is applied to a compression/decompression circuit 48, where the data is compressed. The compressed image data is applied to and recorded on a memory card 60. An arrangement may be adopted in which the management data also is recorded on the memory card 60.

The management data on the image sensing device 10 can be sensed even after the image sensing device 10 has been secured to a circuit board, heat sink or the like. Sensing the management data on the image sensing device 10 makes it possible for the CPU 40 to change, in conformity with the management data, drive conditions such as the voltage applied to the image sensing device 10 by the drive circuit 51 and the timing at which the voltage is applied.

Figure 10A:
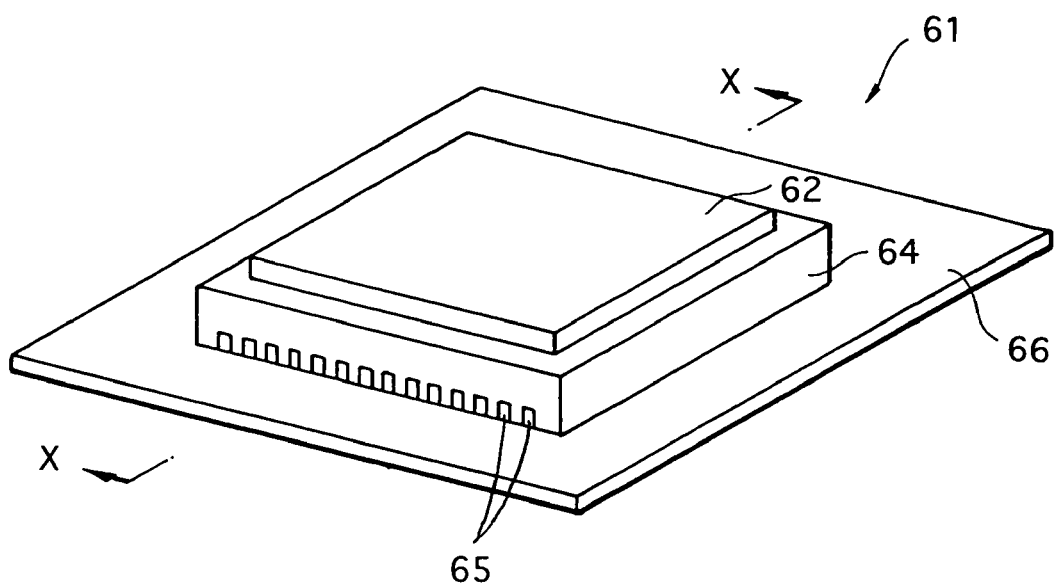
Figure 10:
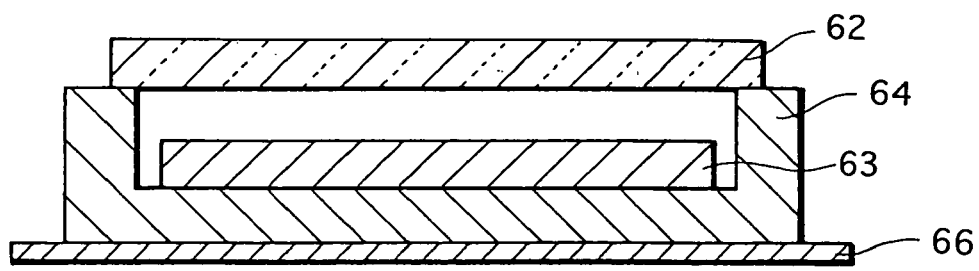

FIGS. 10a and 10b illustrate an image sensing device 61 fixed to a circuit board 66. FIG. 10a is a perspective view and FIG. 10b a sectional view taken along line X-X of FIG. 10a.

The image sensing device 61 includes a CCD 63 for sensing the image of a subject and outputting a video signal representing the image of the subject. The CCD 63 is positioned and placed in a package 64 having a side surface on which metal terminals 65 are formed. The metal terminals 65 are for outputting a video signal and have pulses, which drive the CCD 63, applied thereto. The CCD 63 has a light-receiving surface on which a protective glass 62 is provided to protect the CCD 63. The back side of the image sensing device 61 is affixed to the circuit board 66.

Figure 11:
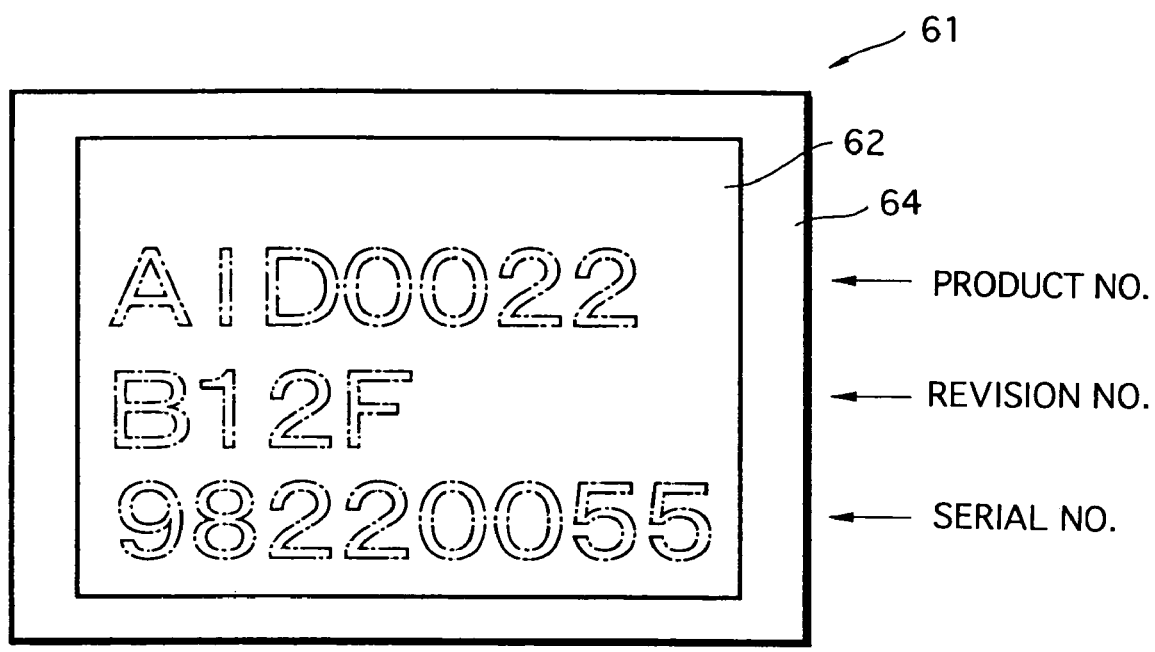
FIG. 11 illustrates the manner in which management data has been recorded on the protective glass of the image sensing device.

FIG. 11 is a plan view of the image sensing device 61.

In the image sensing device 61 according to this embodiment, management data such as product number, revision number and serial number are recorded on the protective glass 62 by infrared-reflecting ink.

When the management data that has been recorded on the protective glass 62 is read, a target image having a uniform pattern is sensed using a flat light source whose emission includes infrared radiation, as will be described later. The portion of the obtained target image that is the management data appears darker than other portions. The management data is obtained by reading the darkened portion.

Since the management data has been recorded on the protective glass 62, it can be read even after the image sensing device 61 has been fixed to the circuit board 66.

When the image of an ordinary subject is sensed, the image of the subject is formed on the CCD 63 of the image sensing device 61 via an infrared blocking filter. Since the infrared radiation is blocked by the filter, the fact that the management data has been recorded on the protective glass 62 can be prevented from having an effect upon the imaging of the subject.

Figure 12:
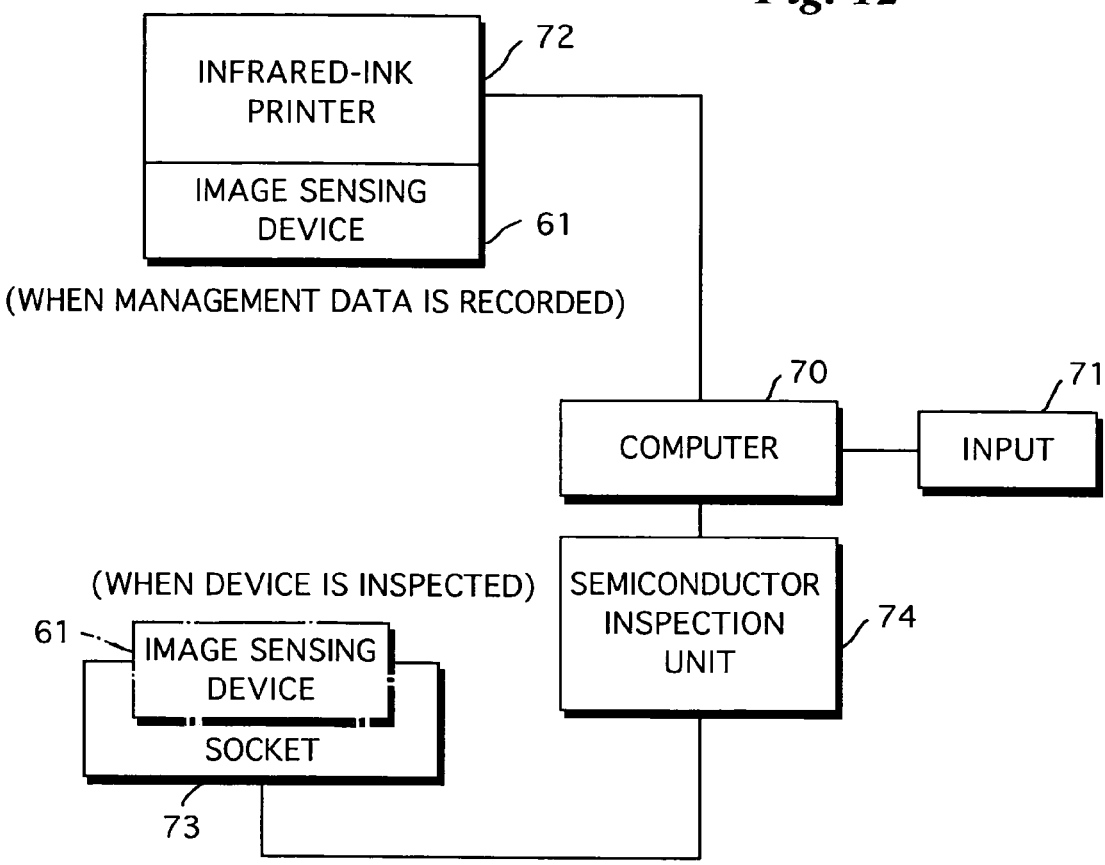
FIG. 12 is a block diagram illustrating the electrical configuration of a management-data recording system.

FIG. 12 is a block diagram illustrating the electrical construction of this management-data recording system.

The overall operation of this management-data recording system is supervised by a computer 70.

The management data concerning the CCD 63 is input from an input unit 71. The input management data is applied to the computer 70.

The management-data recording system includes an infrared-ink printer 72. When the management data is to be recorded on the protective glass 62 of the image sensing device 61, the image sensing device 61 is loaded in the infrared-ink printer 72. The latter is controlled by the computer 70. The management data is recorded on the protective glass 62 of the image sensing device 61 by the infrared-ink printer 72 in which the device has been loaded.

When the image sensing device 61 is inspected, the device is extracted from the infrared-ink printer 72 and mounted in a socket 73. The image sensing device 61 is inspected by a semiconductor inspection device 74.

Figure 13:
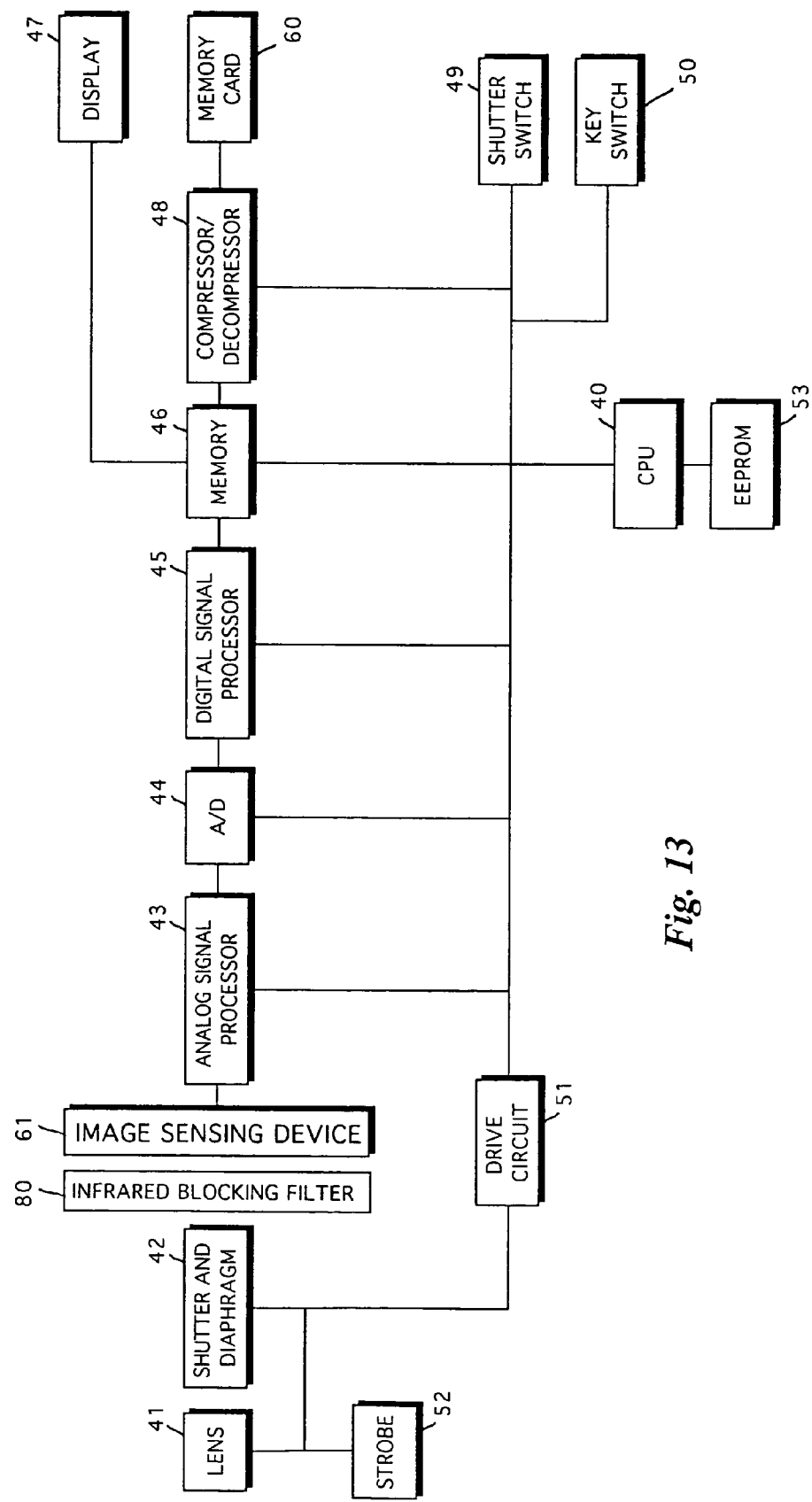
FIG. 13 is a block diagram illustrating the electrical construction of an electronic still-video camera.

FIG. 13 is a block diagram illustrating the electrical construction of an electronic still-video camera (management-data sensing system). Components in FIG. 13 identical with those of the circuit shown in FIG. 8 are designated by like reference characters.

A flat light source capable of emitting light that includes infrared radiation is set up and a target image having a uniform (e.g. all-white) pattern illuminated by the flat light source is prepared.

The image representing the target image is formed on the light-receiving surface of the CCD 63 of the image sensing device 61 by the imaging lens 41 via the shutter and diaphragm 42. Management data has been recorded on the protective glass 62 of the image sensing device 61 by the infrared-reflecting ink in the manner described earlier.

The image sensing device 61 is driven by the drive circuit 51 and outputs a video signal representing the target image. The video signal output by the image sensing device 61 is input to the analog/digital conversion circuit 44 via the analog signal processing circuit 43, whereby the signal is converted to digital image data.

The digital image data is applied to the digital signal processing circuit 45, which proceeds to generate the luminance data Y and color difference data B-Y and R-Y. The luminance data Y and color difference data B-Y, R-Y is applied to the memory 46, where this data is stored temporarily.

The luminance data Y and color difference data B-Y, R-Y is read out of the memory 46 and input to the display 47. The target image obtained by imaging is displayed on the display 47.

In a case where the target image has been sensed using the light source that includes infrared radiation, the infrared radiation is reflected by the management data that has been recorded on the protective glass 62 of the image sensing device 61. As a result, when the target image is displayed on the display 47, the portion of the target image where the management data has been recorded appears darker than the other portions of the target image. Thus, the management data can be read by observing the display 47.

The luminance data Y stored temporarily in the memory 46 is read out and input to the CPU 40. The CPU 40, which has a character recognition function, uses this function to recognize the management data based upon the input luminance data Y. The management data that has been recognized is stored in the EEPROM 53. The management data is read out of the EEPROM and is recorded by being applied to the memory card 60 via the compression/decompression circuit 48. An arrangement may be adopted in which the drive conditions (applied voltage, drive pulses, etc.) of the image sensing device 61 are changed in drive circuit 51 based upon the recognized management data.

When the image of a subject is sensed using the electronic still-video camera shown in FIG. 13, an infrared blocking filter 80 is provided on the front side of the image sensing device 61. The filter 80 blocks infrared radiation and thus prevents it from impinging upon the image sensing device 61. As a result, the image represented by the video signal output from the image sensing device 61 is such that the portion corresponding to the management data and portions other than this portion exhibit identical brightness. This makes it possible to prevent the management data from influencing the sensed image.

When the image of the subject is sensed, it goes without saying that the image data representing the subject image is compressed by the compression/de-compression circuit 48 and then recorded on the memory card 60.

FIG. 14 illustrates an example of a font of the management data.

The font shown in FIG. 14 illustrates an example of an OCR (optical character reader) font. Using an OCR font improves the recognition rate of the management data in CPU 40.

Figure 15A:
FIGS. 15a to 16b illustrate examples of management data.
Figure 15B:

FIGS. 15a and 15b illustrate examples in which the management data is displayed as a bar code. Thus, an arrangement may be adopted in which management data represented by a bar code is displayed on the protective glass 62 of the image sensing device 61.

Figure 16A:
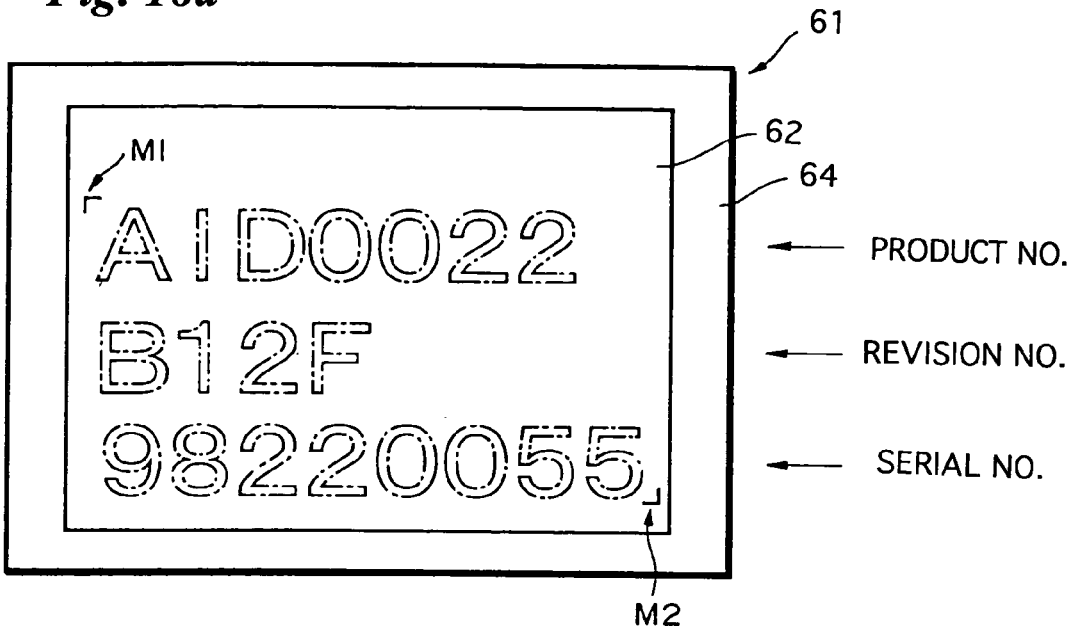
Figure 16B:
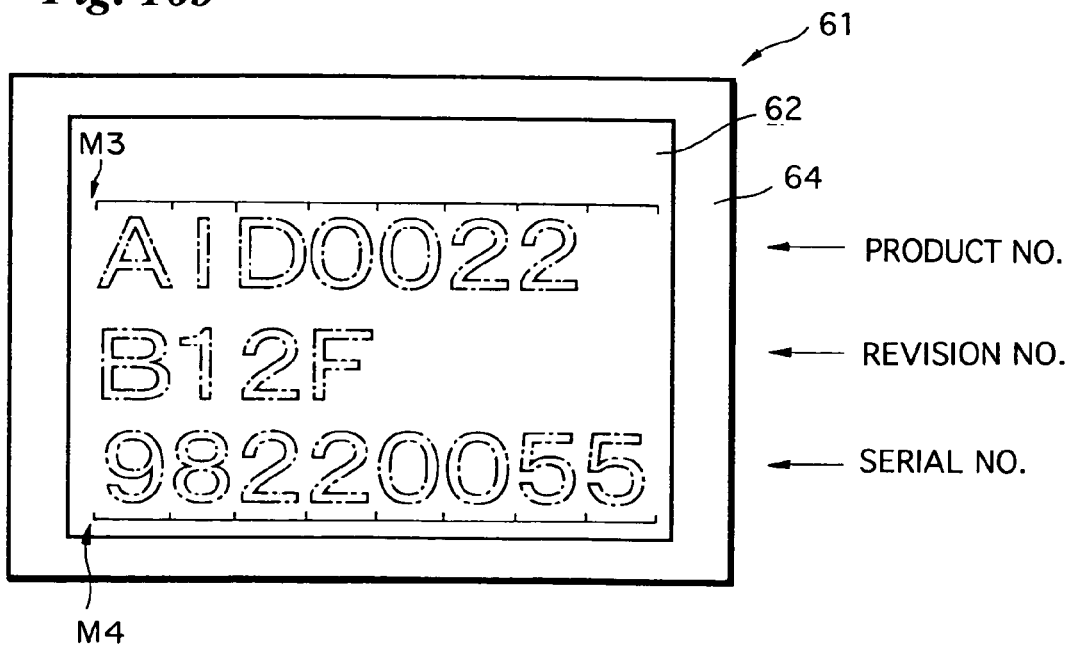

FIGS. 16a and 16b illustrate examples of management data that has been recorded on the protective glass 62.

As shown in FIG. 16a, a reference position mark M1, which indicates the starting position of the management data, has been recorded at the starting position of the management data, and a reference position mark M2, which indicates the end position of the management data, has been recorded at the end position of the management data.

Character recognition processing involves cutting out the area of the image to be recognized. In the example of FIG. 16a, the mark M1 indicating the starting position of the management data and the mark M2 indicating the end position have been recorded on the protective glass 62. This makes it easy to cut the portion in which the management data has been recorded from the image obtained by sensing the target image.

In FIG. 16b, marks M3 and M4 serving as guides of the character positions in the management data have been recorded above and below the management data. In this case also the area in which the management data has been recorded can be cut from the target image relatively easily by referring to the marks M3 and M4.

Figure 17:
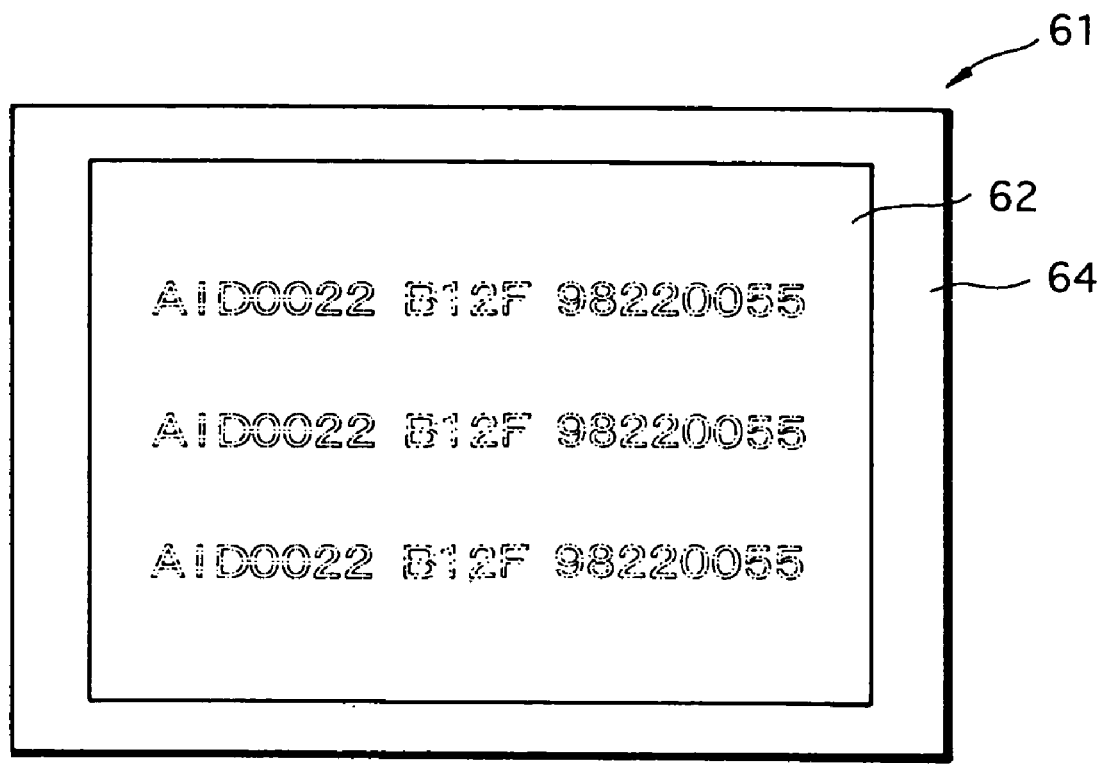
FIGS. 17 and 18 illustrate examples of management data.

FIG. 17 illustrates an example in which management data has been recorded on the protective glass 62.

In the example of FIG. 17, plural items of identical management data have been recorded on the protective glass 62. As a result, if part of an item of management data is difficult to read, it should be possible to read this part of the data in the other items of management data.

Figure 18:
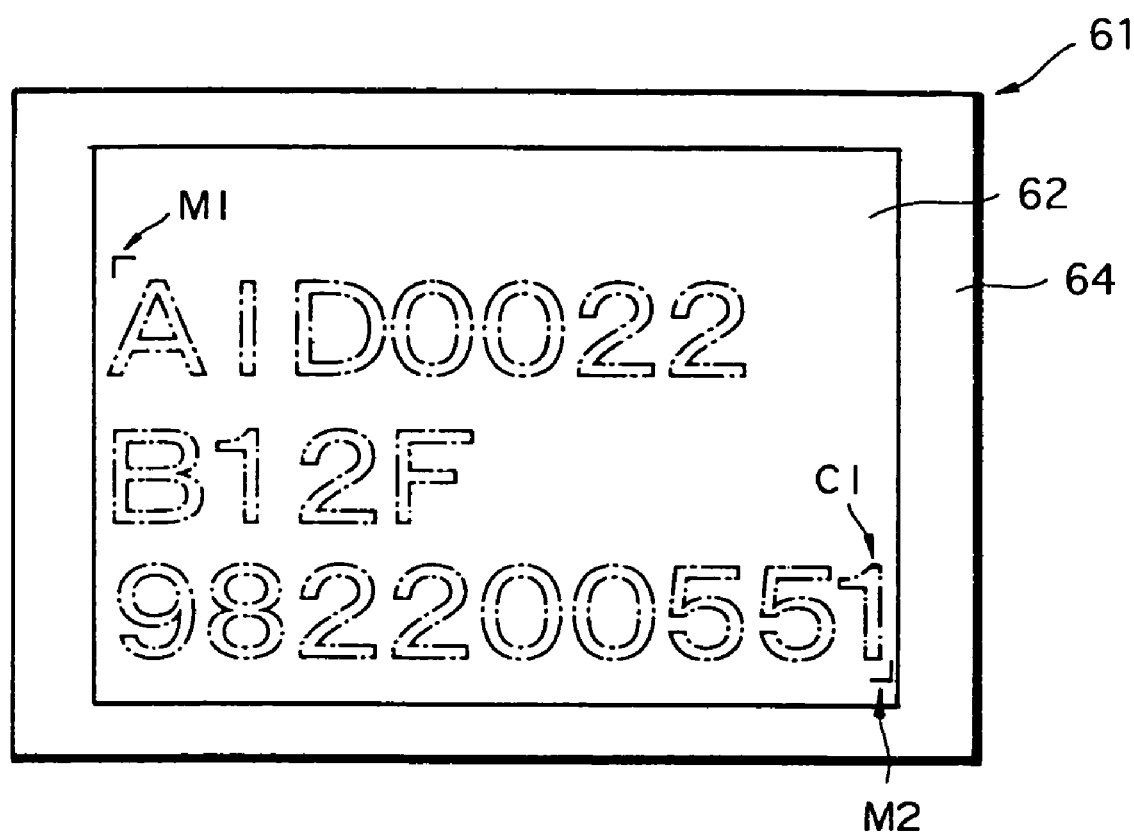

FIG. 18 shows another example in which management data has been recorded on the protective glass 62.

In the example of FIG. 18, a checksum C1 for the management data has been recorded. Using the checksum Cl makes it possible to subject the read management data to an error correction.

Figure 19A:
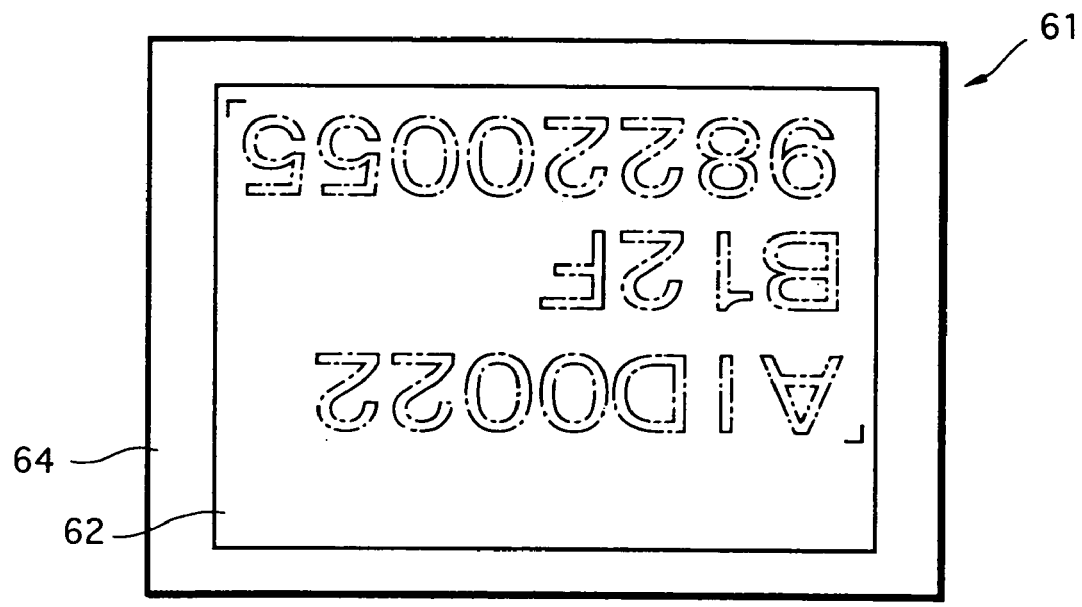
FIG. 19a illustrates an example of management data and FIG. 19b a read-out image that includes the management data.

FIG. 19a shows another example in which management data has been recorded on the protective glass 62.

Figure 19B:
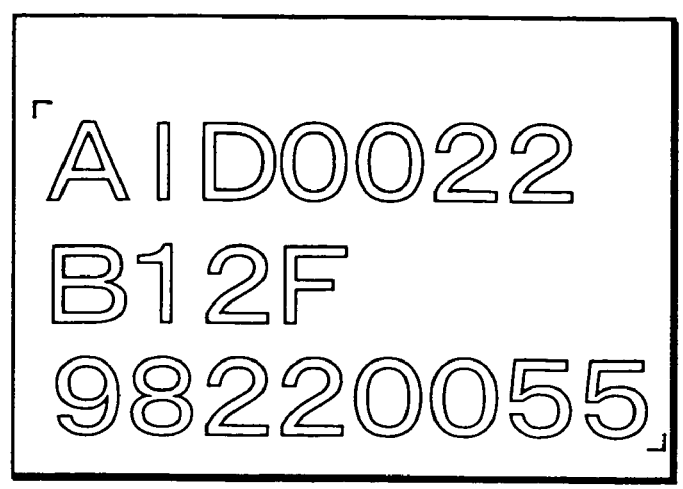

In this example, the management data has been recorded on the protective glass 62 upside down. When the target image for reading out the management data is sensed and displayed on the display 47 as described earlier, the fact that the management data has been recorded upside down means that this data is displayed right-side up, as illustrated in FIG. 19b. This makes it easier to observe the management data.

Figure 20A:
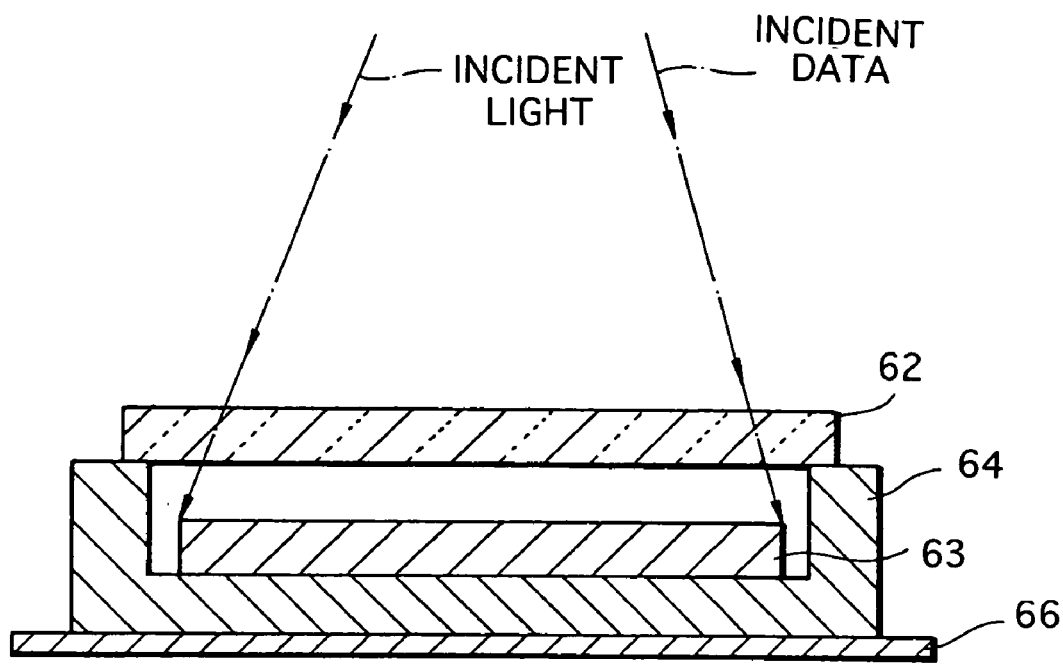
FIG. 20a is a sectional view of an image sensing device and FIG. 20b is a plan view of the image sensing device.
Figure 20B:
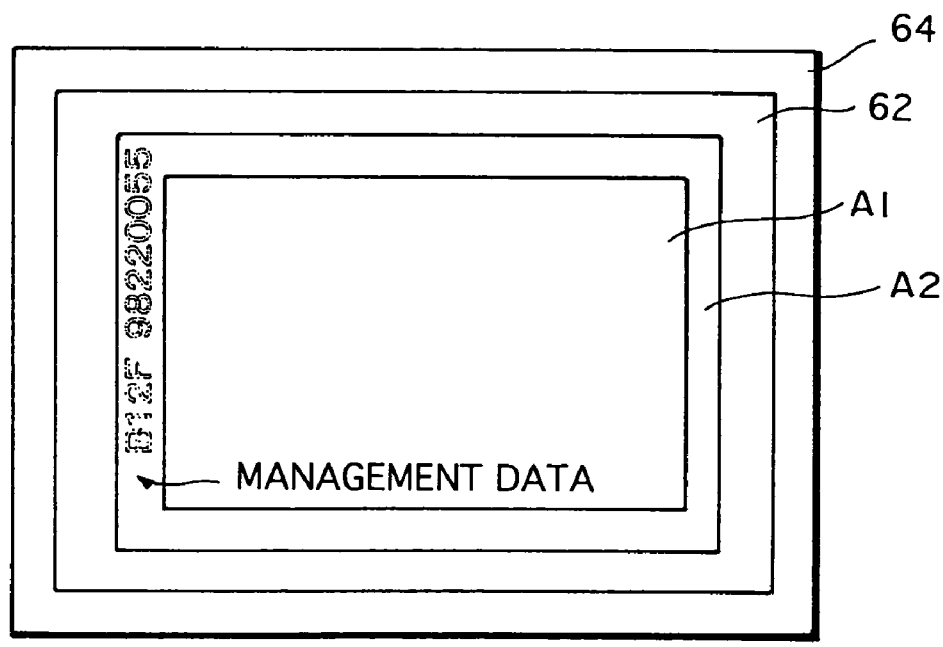

FIG. 20a is a sectional view of the image sensing device 61 and FIG. 20b is a plan view thereof.

The protective glass 62 has an area A1 and a non-effective area A2. If the management data is recorded in the area A1, it will appear on the imaging area of the CCD 63 and affect the imaging of a subject. If the management data is recorded in the non-effective area A2, on the other hand, it will not appear on the imaging area of the CCD 63 and will affect the imaging of a subject.

In the example shown in FIGS. 20a and 20b, the management data has been recorded in the non-effective imaging zone A2 of protective glass 62. Even when the image of a subject is sensed, an image of the management data is not formed on the imaging area of the CCD 63. This makes it unnecessary to provide an infrared filter when the image of a subject is sensed. It goes without saying, however, that an infrared filter may be provided if desired.

Figure 21:
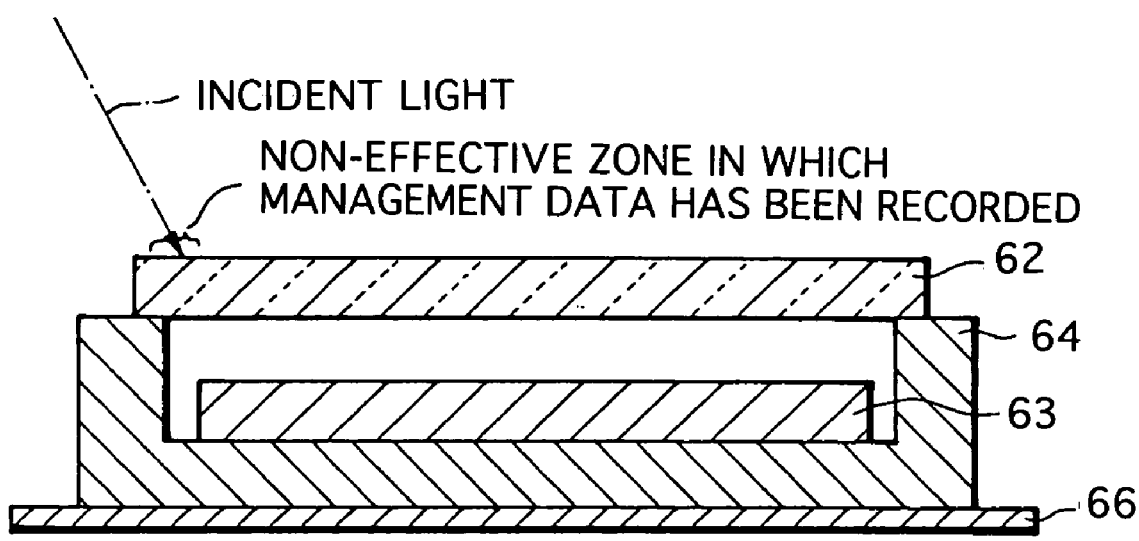
FIG. 21 is a sectional view of an image sensing device.

In a case where management data has been recorded in the non-effective imaging zone A2, as shown in FIGS. 20a and 20b, the image of the management data is not sensed even though the device is irradiated with light inclusive of infrared radiation and the image representing the target image is obtained in the manner described above. As a consequence, the management data cannot be recognized. Accordingly, with the image sensing device 61 secured to the circuit board 66 as shown in FIG. 21, the non-effective imaging zone A2 in which the management data has been recorded is irradiated with the infrared-containing light in the manner depicted in FIG. 21. Since an image representing the management data will be formed in the imaging area of the CCD 63, the management data can be read based upon the video signal output by the image sensing device 61. It goes without saying, however, that the management data may be recorded in the area A1 if desired.

Though the management data is recorded on the protective glass 62 using infrared-reflecting ink, an arrangement may be adopted in which the management data is recorded using a material other than infrared-reflecting ink, e.g., a photodichroic material which, when irradiated with infrared radiation, emits light having a wavelength different from that of the infrared radiation.

Furthermore, an arrangement may be adopted in which the management data is recorded on the protective glass using ink which reflects ultraviolet radiation or a photodichroic material which, when irradiated with ultraviolet radiation, emits light having a wavelength different from that of the ultraviolet radiation. Consider a case where the management data is recorded using ink which reflects ultraviolet radiation or a photodichroic material which, when irradiated with ultraviolet radiation, emits light having a wavelength different from that of the ultraviolet radiation. When the management data is to be read, a target image having a uniform pattern is sensed using a flat light source whose emission includes ultraviolet radiation, and the management data is obtained by reading a dark portion from the obtained target image. When the image of a subject is to be sensed, it goes without saying that an ultraviolet blocking filter is provided in front of the image sensing device.

As many apparently widely different embodiments of the present invention can be made without departing from the spirit and scope thereof, it is to be understood that the invention is not limited to the specific embodiments thereof except as defined in the appended claims.

What is claimed is:

1. A system for recording management data that is for managing solid-state electronic image sensing devices, comprising:
a positioning table for placing a solid-state electronic image sensing device at a predetermined position, said solid-state electronic image sensing device having a light-receiving area and a transparent cover for protecting said light-receiving area;
a management-data input device for inputting management data concerning the solid-state electronic image sensing device;
a material ejection device for ejecting an invisible-light-responsive material which, by being irradiated with invisible light, emits light relating to the invisible light with which it is being irradiated; and
a recording control device for controlling said material ejection device in such a manner that the management data input from said management-data input device will be recorded on the cover of the solid-state electronic image sensing device, which has been placed on said positioning table, using the material ejected from said material ejection device.

2. The system according to claim 1, wherein said material ejection device ejects at least one invisible-light-responsive material selected from an invisible-light-responsive material which, by being irradiated with invisible light, reflects the invisible light with which it is being irradiated, and an invisible-light-responsive material which, by being irradiated with invisible light, emits light having a wavelength different from the wavelength of the invisible light with which it is being irradiated.

3. The system according to claim 1, wherein said recording control device records the management data on the cover in the form of at least one of an OCR font and a bar code.

4. The system according to claim 1, wherein said recording control device further records a reference position of the management data on said cover.

5. The system according to claim 1, wherein said recording control device controls said material ejection device so as to record a plurality of items of identical management data.

6. The system according to claim 1, wherein said recording control device controls said material ejection device so as to record a code, which is for checking the management data, on said cover.

7. The system according to claim 1, wherein said recording control device controls said material ejection device in such a manner that the management data is recorded on said cover as an inverted image.

8. The system according to claim 1, wherein said recording control device controls said material ejection device so as to record the management data on an area of said cover other than an area which forms an image on the light-receiving area.

9. A system for sensing management data that is for managing solid-state electronic image sensing devices, comprising:
an irradiating device for irradiating, with light that includes invisible light, a transparent cover, which is for protecting a light-receiving area, of a solid-state electronic image sensing device driven by a driving device, wherein management data has been recorded on said cover by a material which, by being irradiated with invisible light, emits light relating to the invisible light with which it is being irradiated;
an invisible-light sensing device for sensing the light relating to the invisible light emitted from the cover owing to irradiation with the light from said irradiating device; and
a management-data output device for outputting the management data based upon the light relating to the invisible light sensed by said invisible-light sensing device.

10. The system according to claim 9, further comprising a drive control device for changing drive conditions of said driving device based upon management data output from said management-data output device.

11. A solid-state electronic image sensing device comprising:
a light-receiving area;
a transparent cover for protecting said light-receiving area; and
management data that has been formed on said transparent cover by a material which, by being irradiated with invisible light, emits light relating to the invisible light with which it is being irradiated.

12. A method of recording management data that is for managing solid-state electronic image sensing devices, comprising the steps of:
- placing a solid-state electronic image sensing device at a predetermined position, said solid-state electronic image sensing device having a light-receiving area and a transparent cover for protecting said light-receiving area;
- inputting management data concerning the solid-state electronic image sensing device;
- ejecting a material which, by being irradiated with invisible light, emits light relating to the invisible light with which it is being irradiated; and
- recording the input management data on the cover of the placed solid-state electronic image sensing device using the ejected material.

13. A method of sensing management data that is for managing solid-state electronic image sensing devices, comprising the steps of:
- irradiating, with light that includes invisible light, a transparent cover, which is for protecting a light-receiving area, of a solid-state electronic image sensing device, wherein management data has been recorded on said cover by a material which, by being irradiated with invisible light, emits light relating to the invisible light with which it is being irradiated;
- sensing the light relating to the invisible light emitted from the cover owing to irradiation with the light; and
- outputting the management data based upon the light relating to the sensed invisible light.

* * * * *